United States Patent
Feng (10) Patent No.: US 10,103,082 B2
(45) Date of Patent: Oct. 16, 2018

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventor: JunHong Feng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/613,717

(22) Filed: Jun. 5, 2017

(65) Prior Publication Data

US 2018/0005915 A1    Jan. 4, 2018

(30) Foreign Application Priority Data

Jul. 1, 2016    (CN) .......................... 2016 1 0510621

(51) Int. Cl.
*H01L 23/367*    (2006.01)
*H01L 23/373*    (2006.01)
(Continued)

(52) U.S. Cl.
CPC ...... *H01L 23/3672* (2013.01); *H01L 23/3677* (2013.01); *H01L 23/3736* (2013.01);
(Continued)

(58) Field of Classification Search
CPC ......... H01L 21/823431; H01L 27/0248; H01L 27/0266; H01L 23/60
See application file for complete search history.

(56) References Cited

U.S. PATENT DOCUMENTS

2008/0116515 A1    5/2008   Gossner et al.
2014/0191319 A1*  7/2014   Cheng ................... H01L 29/861
                                                    257/347
(Continued)

OTHER PUBLICATIONS

European Search Report for corresponding European Application No. 17178155.2 dated Dec. 8, 2017.
(Continued)

*Primary Examiner* — Jae Lee
(74) *Attorney, Agent, or Firm* — Brinks Gilson & Lione (57) ABSTRACT

The present disclosure is directed to a semiconductor device and a manufacturing method thereof, which relate to the field of semiconductor technologies. The semiconductor device includes a fin ESD element. The method includes: providing a substrate structure, where the substrate structure includes a semiconductor substrate, and a semiconductor fin for the fin ESD element and an electrode structure surrounding a part of the semiconductor fin that are on the semiconductor substrate; forming a second dielectric layer on the substrate structure to cover the electrode structure; forming, in the second dielectric layer, a trench extending to a top of the electrode, where the trench is on the electrode and extends along a longitudinal direction of the electrode, and a transverse width of the trench is less than or equal to a transverse width of the top of the electrode; and filling the trench with a metal material, so as to form a metal heat sink that is on the top of the electrode and is coupled to the electrode. With the present disclosure, an existing structure of an ESD element is improved, so that a metal heat sink can effectively improve a head dissipation effect of a device, thereby improving a performance of the device.

12 Claims, 10 Drawing Sheets

(51) Int. Cl.
*H01L 23/60* (2006.01)
*H01L 27/02* (2006.01)
*H01L 29/78* (2006.01)
*H01L 29/423* (2006.01)

(52) U.S. Cl.
CPC .......... *H01L 23/60* (2013.01); *H01L 27/0266* (2013.01); *H01L 27/0288* (2013.01); *H01L 29/42372* (2013.01); *H01L 29/42384* (2013.01); *H01L 29/785* (2013.01)

(56) References Cited

U.S. PATENT DOCUMENTS

| | | |
|---|---|---|
| 2015/0008525 A1 | 1/2015 | Fukuzaki et al. |
| 2015/0123099 A1 | 5/2015 | Shin et al. |
| 2015/0187753 A1 | 7/2015 | Campi et al. |

OTHER PUBLICATIONS

Jiang et al., Experimental investigation of self heating effect (SHE) in multiple-fin SOI FinFETs; Semicond. Sci. Technol 29:11(2014) 115021, pp. 1-7; UK.

* cited by examiner

SEMICONDUCTOR DEVICE AND MANUFACTURING METHOD THEREFOR

CROSS-REFERENCE TO RELATED APPLICATION

This application is based on and claims priority to Chinese patent Application CN201610510621.3, filed Jul. 1, 2016, the entire content of which is incorporated herein by reference.

BACKGROUND

Technical Fields

The present disclosure relates to the field of semiconductor technologies, and in particular, to a semiconductor device and a manufacturing method thereof. More particularly, the present disclosure relates to a device with a fin electro-static discharge (ESD) element and a manufacturing method thereof.

Related Art

With a continuing decrease of geometric dimensions of semiconductor devices, semiconductor devices are more easily damaged by static electricity. Therefore, ESD protection of an integrated circuit chip becomes increasingly important.

Figure 1:
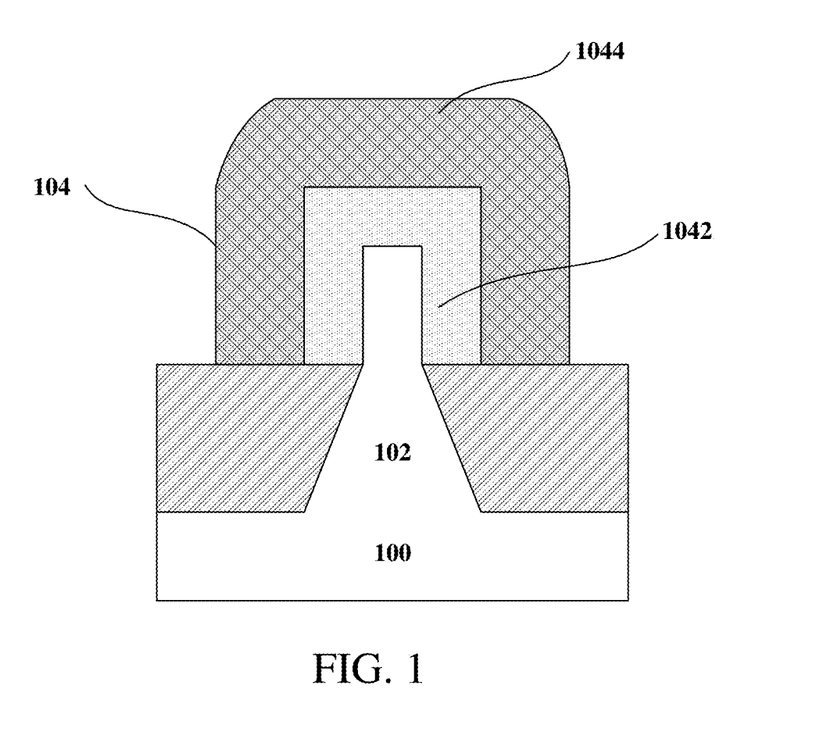
FIG. 1 is a schematic plane view of a semiconductor device in the prior art.
Figure 2:
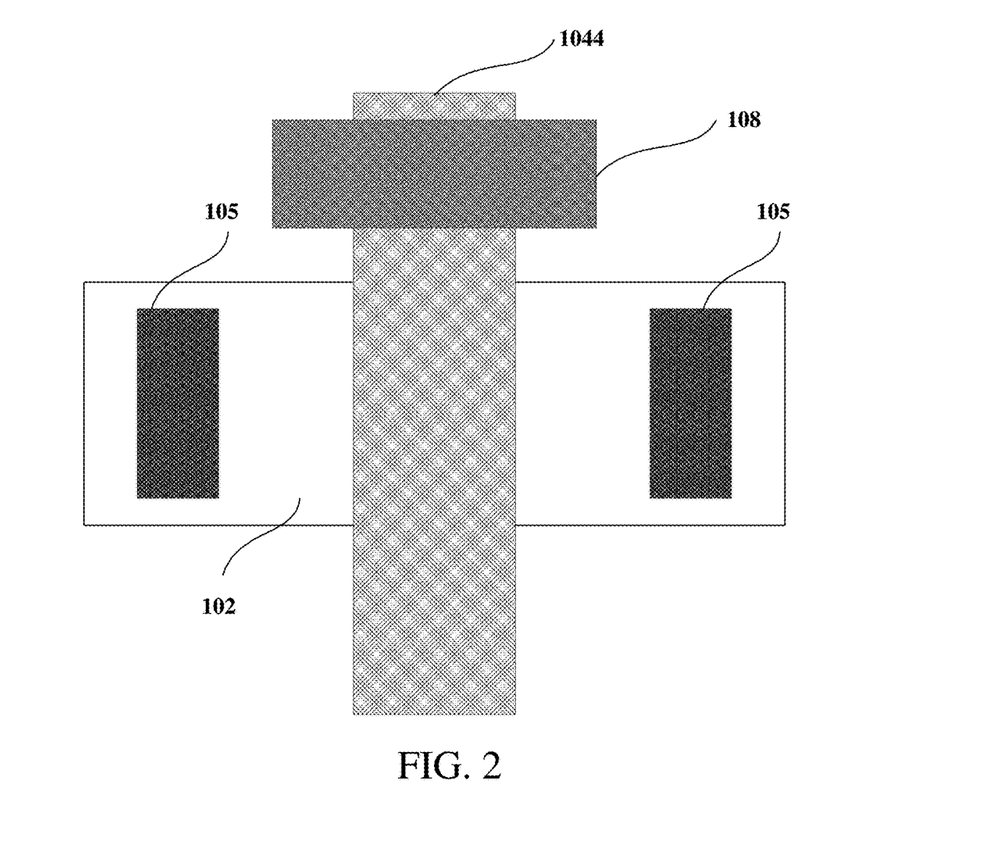
FIG. 2 is a cross sectional view of a semiconductor device in the prior art.

FIG. 1 and FIG. 2 respectively show a plane view of a semiconductor device with a fin ESD element in the prior art and a cross sectional view of a cross section vertical to a fin direction of the semiconductor device with a fin ESD element in the prior art. As shown in FIG. 1, the semiconductor device includes a semiconductor substrate 100, and a semiconductor fin for an ESD element and an electrode structure 104 surrounding the fin that are on the substrate. The electrode structure 104 includes a dielectric layer 1042 surrounding the fin 102 and an electrode 1044 on the dielectric layer 1042. The semiconductor device further includes active region electrodes 105 as shown in FIG. 2. However, with a continuing decrease of a size of an element, heat generated during operation of the element has an increasingly notable impact on a performance of the element, which is particularly important to a fin ESD element. A problem of heat dissipation of a fin ESD element attracts increasing attention.

Therefore, an existing structure of a fin ESD element needs to be improved, so as to further improve a heat dissipation of a device, thereby improving a performance of the device.

SUMMARY

The inventor of the present disclosure discovers the foregoing problems existing in the prior art, and provides the present disclosure to address at least one of the foregoing problems.

In one aspect of the present disclosure, a manufacturing method of a semiconductor device is provided. The semiconductor device includes a fin ESD element. The method includes: providing a substrate structure, where the substrate structure includes a semiconductor substrate, and a semiconductor fin for the fin ESD element and an electrode structure surrounding a part of the semiconductor fin that are on the semiconductor substrate, where the electrode structure includes a first dielectric layer surrounding the part of the semiconductor fin and an electrode on the first dielectric layer. The method further includes forming a second dielectric layer on the substrate structure to cover the electrode structure; forming, in the second dielectric layer, a trench extending to top of the electrode, where the trench is on the electrode and extends along a longitudinal direction of the electrode, where a transverse width of the trench is less than or equal to a transverse width of the top of the electrode; and filling the trench with a metal material, so as to form a metal heat sink that is on the top of the electrode and is coupled to the electrode.

In some forms, the substrate structure further includes an isolation structure on the semiconductor substrate; wherein an upper surface of the isolation structure is lower than an upper surface of the fin; and wherein the electrode structure is on the isolation structure.

In some forms, the second dielectric layer further includes an opening for forming electrode interconnection, wherein the opening and the trench are isolated from each other; and wherein the step of filling the trench with a metal material includes filling the opening with the metal material, so as to form the electrode interconnection at the opening.

In some forms, the metal heat sink and the electrode interconnection are separated from each other, and upper surfaces thereof are substantially flush with each other.

In some forms, there is at least one metal heat sink.

In some forms, spacing of each trench is greater than 0.04 micrometer, and a distance between each trench and an edge at either side of the electrode is greater than 0.05 micrometer.

In some forms, a material for forming the metal heat sink includes tungsten or copper.

In another aspect of the present disclosure, a semiconductor device is provided, including: a fin ESD element, and further including: a substrate structure, where the substrate structure includes a semiconductor substrate, and a semiconductor fin for the fin ESD element and an electrode structure surrounding a part of the semiconductor fin that are on the semiconductor substrate, where the electrode structure includes a first dielectric layer surrounding the part of the fin and an electrode on the first dielectric layer. The semiconductor device further includes a second dielectric layer on the substrate structure and a metal heat sink that is in the second dielectric layer, is on the top of the electrode, and is coupled to the electrode, where the metal heat sink extends along a longitudinal direction of the electrode, and where a transverse width of the metal heat sink is less than or equal to a transverse width of the top of the electrode.

In some forms, the substrate structure further includes an isolation structure on the semiconductor substrate; where an upper surface of the isolation structure is lower than an upper surface of the fin; and where the electrode structure is on the isolation structure.

In some forms, the second dielectric layer further includes electrode interconnection, where the electrode interconnection and the metal heat sink are isolated from each other.

In some forms, the metal heat sink and the electrode interconnection are separated from each other, where an upper surface of the metal heat sink is substantially flush with an upper surface of the electrode interconnection.

In some forms, there is at least one metal heat sink.

In some forms, spacing of each heat sink in the metal heat sink is greater than 0.04 micrometer, and a distance between each heat sink and an edge at either side of the electrode is greater than 0.05 micrometer.

In some forms, a metal material for forming the metal heat sink includes tungsten or copper.

Further features of the present disclosure and advantages thereof will become apparent from the following detailed description of the exemplary embodiments of the present invention with reference to the accompanying drawings.

BRIEF DESCRIPTION OF THE DRAWINGS

The accompanying drawings, which constitute a part of the specification, illustrate forms of the present disclosure and, together with the specification, serve to explain the principles of the present disclosure.

With reference to the accompanying drawings, the present disclosure can be more clearly understood based on the following detailed description.

DETAILED DESCRIPTION

Various exemplary forms of the present disclosure will be described in detail with reference to the accompanying drawings. It should be noted that the relative arrangement of the components and steps, the numerical expressions, and the numerical values set forth in these forms do not limit the scope of the present disclosure unless it is specifically stated otherwise.

Meanwhile, it should be understood that, for the convenience of description, various components shown in the figures are not drawn according to their actual dimension proportion relations.

The following description of at least one exemplary form is merely illustrative in nature and is in no way intended to limit the disclosure, its application, or uses.

Techniques, methods, and devices as known by a person of ordinary skill in the art may not be discussed in detail but are intended to be part of the specification where appropriate.

In all of the examples illustrated and discussed herein, any specific values should be interpreted to be illustrative only and non-limiting. Thus, other examples of the exemplary forms may have different values.

It should be noted that similar reference numerals and letters refer to similar items in the following figures, and thus once an item is defined in one figure, it is possible that it does not need to be further discussed in subsequent figures.

Figure 3:
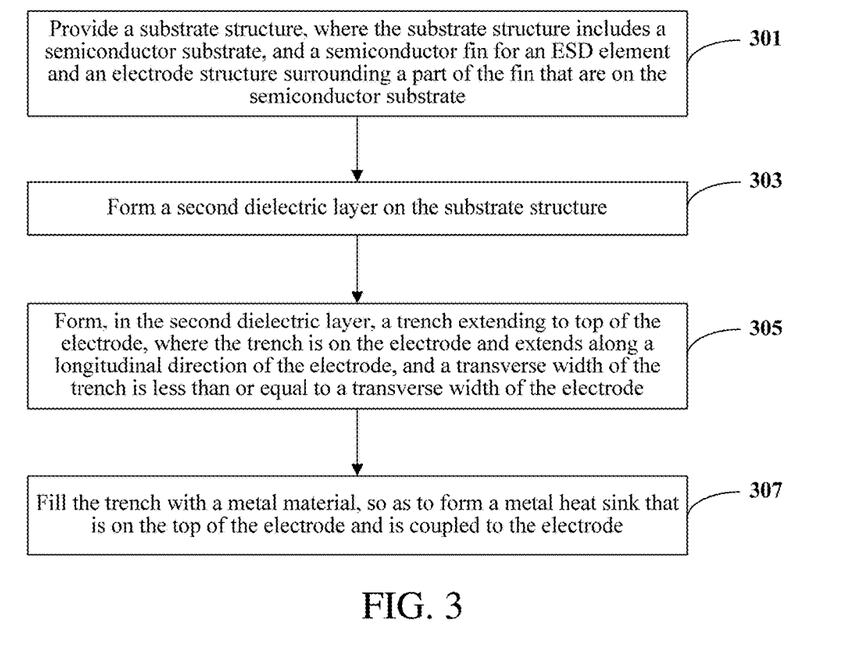
FIG. 3 is a schematic flowchart of a manufacturing method of a semiconductor device.
Figure 8:
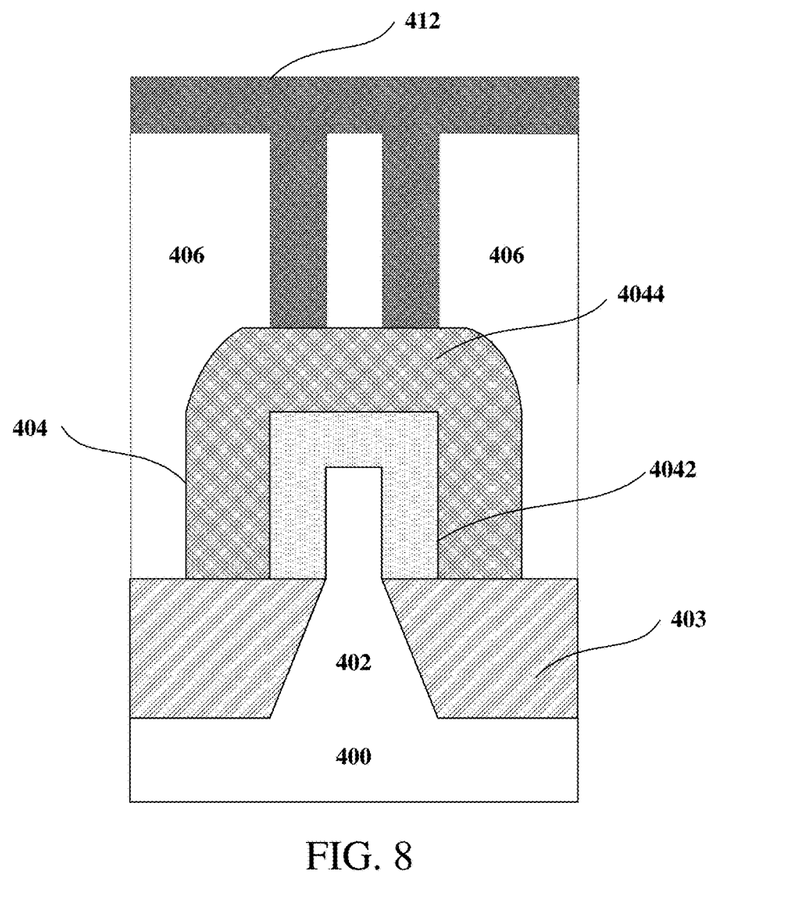
Figure 9:
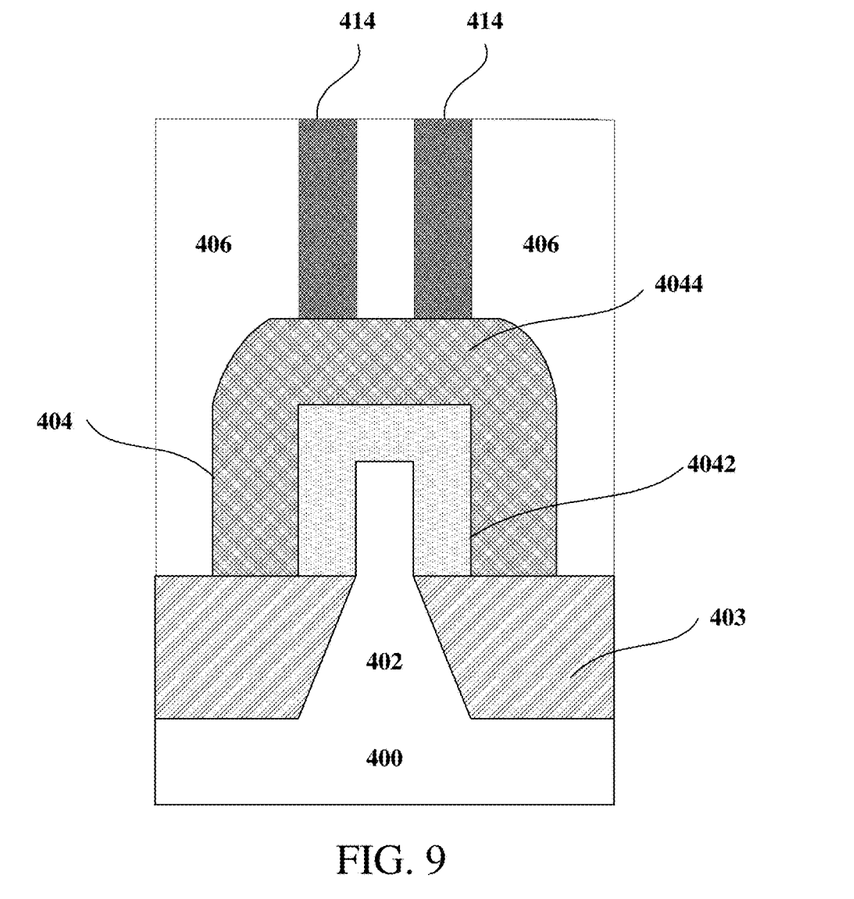
Figure 10:
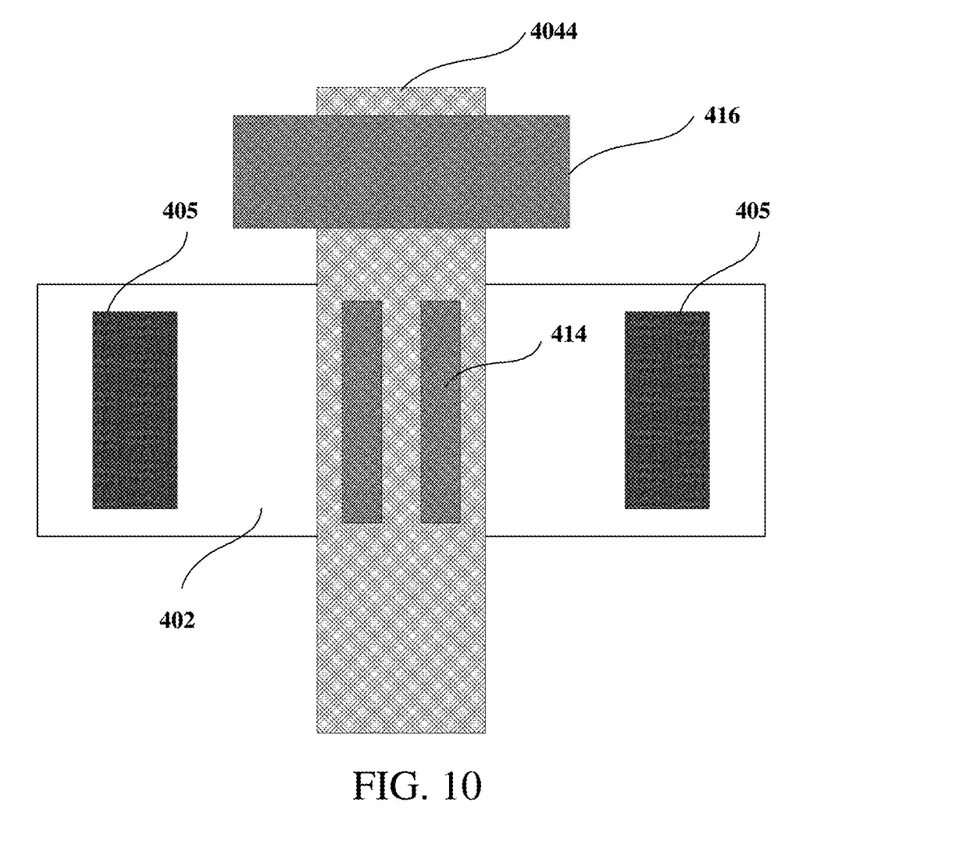
FIG. 10 is a schematic plane view of a semiconductor device.

FIG. 3 is a schematic flowchart of a manufacturing method of a semiconductor device with a fin ESD element. FIG. 4 to FIG. 9 show schematic diagrams of several phases of a manufacturing process of a semiconductor device. FIG. 10 is a schematic plane view of a semiconductor device. Description is made below with reference to FIG. 3, FIG. 4 to FIG. 9, and FIG. 10.

As shown in FIG. 3, at step 301, a substrate structure is provided.

Figure 4:
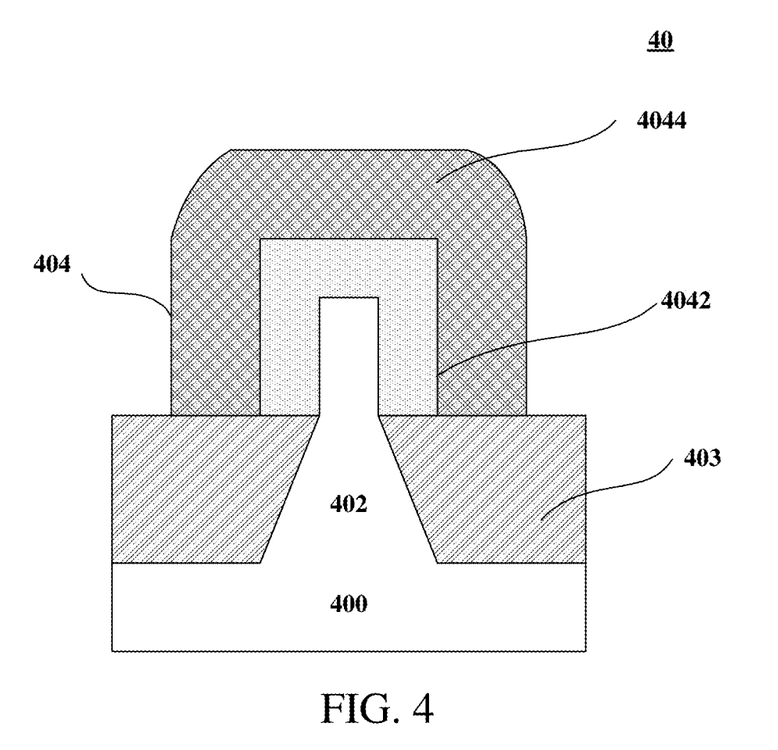
FIG. 4 to FIG. 9 schematically show schematic diagrams of several phases of a manufacturing process of a semiconductor device.

As shown in FIG. 4, a substrate structure 40 may include a semiconductor substrate 400, and a semiconductor fin 402 for an ESD element and an electrode structure 404 surrounding a part of the fin 402 that are on the semiconductor substrate 400. The semiconductor substrate 400 is not particularly limited. For example, the semiconductor substrate 400 may be a bulk semiconductor substrate such as a bulk silicon substrate, or may be a semiconductor on insulator (SOI) substrate such as a silicon on insulator substrate.

The semiconductor fin 402 of the fin ESD element may include a doped region with N-type or P-type impurities.

The electrode structure 404 may include a first dielectric layer 4042 surrounding the part of the fin 402 (e.g. as shown in the cross sectional view of FIG. 4, a part of side wall and a top portion of the fin 402) and an electrode 404 on the first dielectric layer 4042. Here, the electrode 404 may function as a gate electrode, or may operate like a gate electrode. A material of the first dielectric layer 4042 may include, but not limited to, silicon oxides, metal oxides, and metal nitrides, and a material of the electrode 404 may include, but not limited to, metal materials such as tungsten, titanium, nickel, platinum, and rhodium.

In some implementations, the substrate structure 40 may further include an isolation structure 403 on the semiconductor substrate 400. The isolation structure 403 may include a shallow trench isolation (STI) structure or another isolation structure known in the art. As shown in FIG. 4, an upper surface of the isolation structure 403 is lower than an upper surface of the fin 402, and the electrode structure 404 is on the isolation structure 403. It should be understood that the substrate structure of the present disclosure can be formed by using methods, process steps, materials, and the like known in the art. Therefore, details of the process for forming the substrate structure are not described in detail herein.

Referring to FIG. 3, at step 303, a second dielectric layer is formed on the substrate structure, so as to cover the electrode structure.

Figure 5:
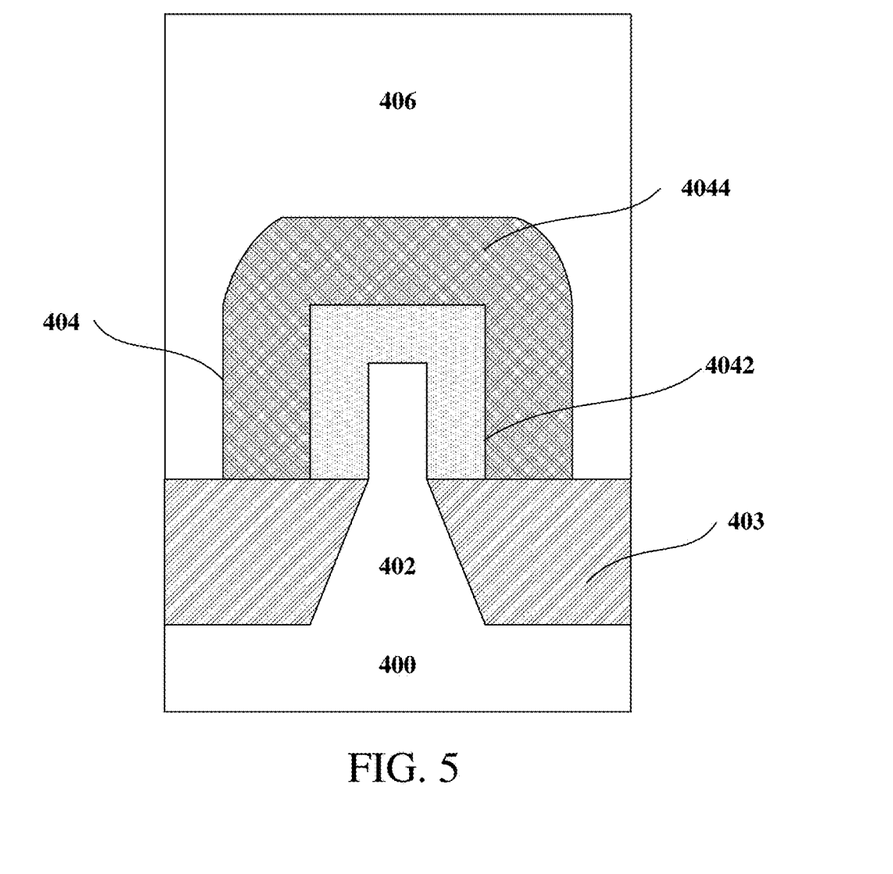

As shown in FIG. 5, a second dielectric layer 406 is formed on the substrate structure 40, so as to cover the electrode structure 402. A material of the second dielectric layer 406 may include, but not limited to, materials such as silicon oxides.

Referring back to FIG. 3, at step 305, a trench extending to a top of the electrode is formed in the second dielectric layer.

Figure 6:
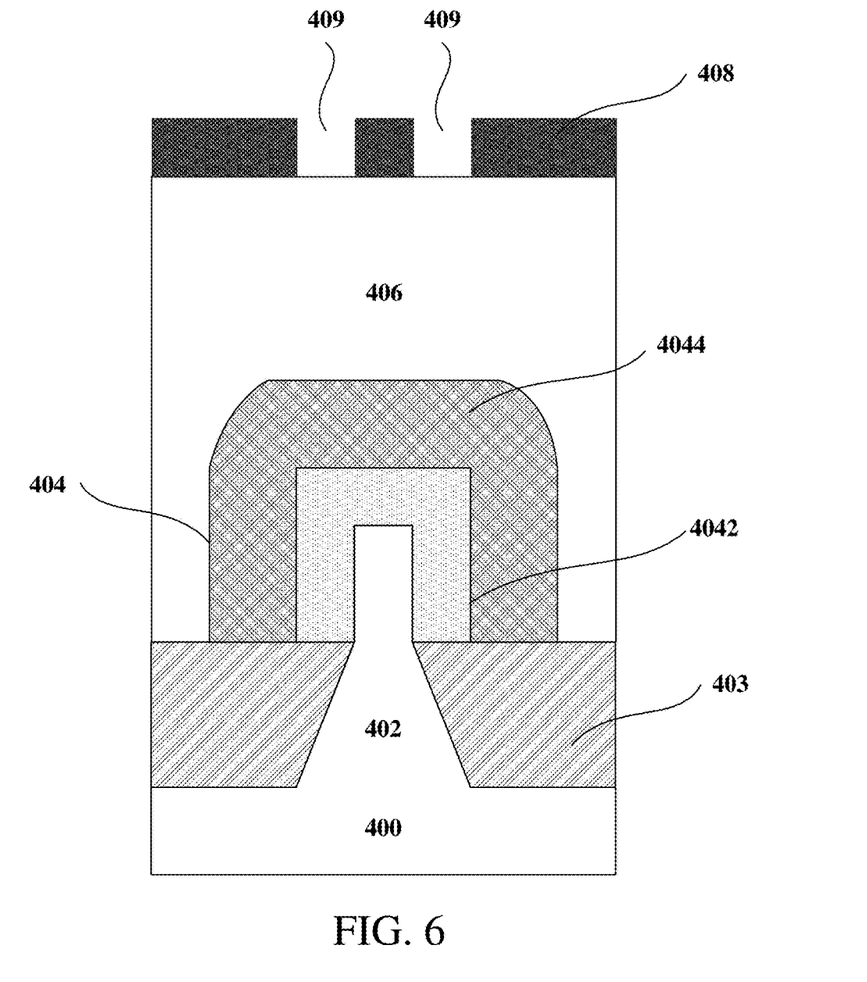
Figure 7:
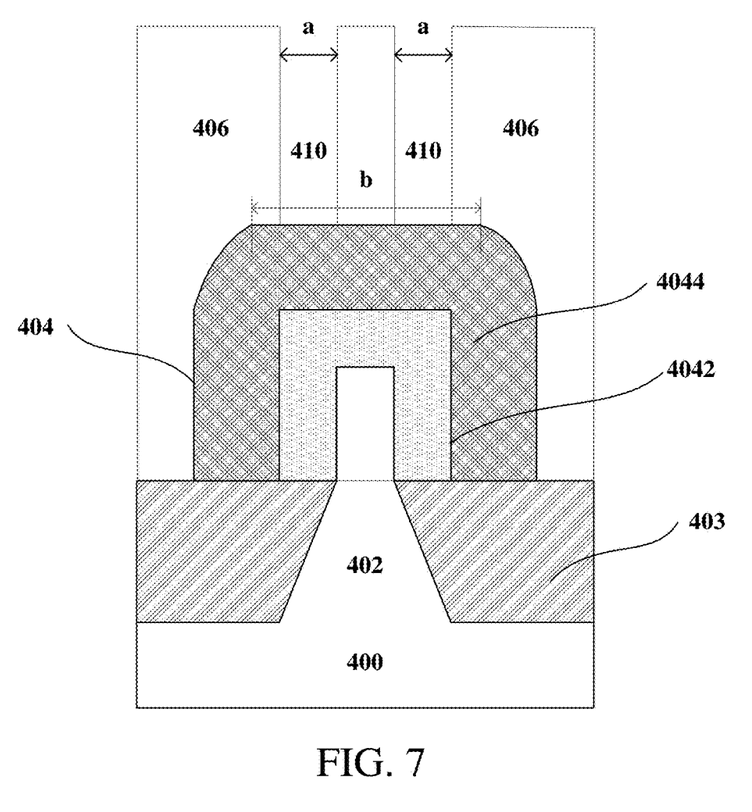

In some implementations, trenches 410 may be formed as follows. As shown in FIG. 6, a patterned mask layer 408 is formed on the second dielectric layer 406. For example, the mask layer 408 may have openings 409 corresponding to trenches 410 formed in a later step (FIG. 7). A material of the mask layer 408 may include silicon oxides, silicon nitrides, and the like. Subsequently, the second dielectric layer 406 is etched to form the trenches 410 extending to the top of the electrode 4044, as shown in FIG. 7. The trenches 410 are on the electrode 4044 and extend along a longitudinal direction of the electrode 4044, and a transverse width a of each of the trenches 410 is less than or equal to a transverse width b of the electrode 4044, as shown in FIG. 7. Optionally, the mask layer 408 may be removed later. In an example, the mask layer 408 may be a hard mask that is formed by a material such as silicon nitride.

In some forms, spacing of each trench is greater than 0.04 micrometer, and a distance between each trench and an edge at either side of the electrode 4044 is greater than 0.05 micrometer. In other forms, in a case that each trench meets the foregoing conditions, trenches are formed as many as possible, so that metal heat sinks are formed as many as possible in a later step, thereby achieving a better heat dissipation effect.

In some implementations, the trenches 410 and openings (not shown in the figures) that are used to form electrical interconnection (e.g. a through hole) to the electrode may be formed at a same step. For example, the patterned mask layer 408 is formed on the second dielectric layer 406, and the mask layer has two types of openings that separately correspond to the trenches 410 formed at a later step and openings that are used to form electrical interconnection to the electrode. Subsequently, the second dielectric layer 406 is etched, so as to form the trenches 410 and the openings that are used to form the interconnection. The openings that are used to form the interconnection and the trenches 410 may be separated from each other.

The trenches 410 are on the electrode 4044 and extend along a longitudinal direction of the electrode 4044, and a transverse width of each of the trenches is less than or equal to a transverse width of the top of the electrode, as shown in FIG. 7.

Finally, referring to FIG. 3, at step 307, the trench is filled with a metal material, so as to form a metal heat sink that is on the top of the electrode and is coupled to the electrode.

In some implementations, the metal heat sink may be formed as follows. As shown in FIG. 8, the trenches 410 are filled with a metal material to form a metal layer 412. Subsequently, the metal layer 412 is thinned, by using chemical mechanical polishing (briefly referred to as CMP), to be flush with or substantially flush with the second dielectric layer 406, so as to form metal heat sinks 414, as shown in FIG. 9. The metal material for forming the metal heat sinks 414 may include tungsten or copper.

In some implementations, when the second dielectric layer 406 further includes openings that are used to form electrical interconnection to the electrode, a metal material may be used to fill the trenches 410 and the openings that are used to form the interconnection, and subsequently, the metal layer 412 is thinned, by using a process such as CMP, to be flush with or substantially flush with the second dielectric layer 406, so as to form metal heat sinks 414 in the trenches 410, and form interconnection 416 in the openings, as shown in a top view of FIG. 10. In some forms, the metal heat sinks 414 and the electrode interconnection 416 are separated from each other, and upper surfaces thereof are substantially flush with each other, as shown in FIG. 10. However, the disclosure is not limited thereto. The metal material for forming the metal heat sinks 414 and the electrode interconnection 416 may include tungsten or copper.

As shown in FIG. 10, the heat sinks 414 are on the electrode 4044 and extend along a longitudinal direction of the electrode (a length direction, or a direction along which the electrode transversally crosses the fin), where a transverse width of each heat sink is less than or equal to a transverse width of the top of the electrode. In some implementations, being viewed from a top view, the heat sinks 414 do not extend out of the electrode 4044.

In addition, FIG. 10 further shows active region electrodes 405 (e.g. source electrodes or drain electrodes) of the fin 402.

The metal heat sinks 414 can effectively improve a heat dissipation effect of a device when the fin ESD element operates, so as to improve a performance of the device.

It should be understood that the present disclosure further teaches a semiconductor device that includes a fin ESD element, and further includes: a substrate structure, where the substrate structure includes a semiconductor substrate, and a semiconductor fin for the fin ESD element and an electrode structure surrounding a part of the semiconductor fin that are on the semiconductor substrate, where the electrode structure includes a first dielectric layer surrounding the part of the fin and an electrode on the first dielectric layer. The semiconductor device further includes a second dielectric layer formed on the substrate structure and a metal heat sink that is formed in the second dielectric layer, is on the top of the electrode, and is coupled to the electrode, where the metal heat sink extends along a longitudinal direction of the electrode, and where a transverse width of the metal heat sink is less than or equal to a transverse width of the electrode.

In some implementations, the substrate structure further includes an isolation structure on the semiconductor substrate, where an upper surface of the isolation structure is lower than an upper surface of the fin and where the electrode structure is on the isolation structure.

In some implementations, the second dielectric layer further includes electrode interconnection, and the electrode interconnection and the metal heat sink are isolated from each other.

In some implementations, the metal heat sink and the electrode interconnection are separated from each other, and upper surfaces thereof are substantially flush with each other.

In some implementations, there is at least one metal heat sink.

In some implementations, spacing of each heat sink in the metal heat sink is greater than 0.04 micrometer, and a distance between each heat sink and an edge at either side of the electrode is greater than 0.05 micrometer.

In some implementations, a metal material for forming the metal heat sink includes tungsten or copper.

Above, a semiconductor device and a manufacturing method according to exemplary forms of the present disclosure are described in detail. In order not to obscure the concepts of the present disclosure, some details known in the art are not described. A person skilled in the art will appreciate how to implement the technical solutions disclosed herein based on the above descriptions. In addition, the forms described in the disclosure of this specification can be freely combined. It should be understood by a person skilled in the art that various modifications can be made to the forms described above without departing from the spirit and scope of the present disclosure defined by the attached claims.

What is claimed is:

1. A manufacturing method of a semiconductor device, wherein the semiconductor device comprises a fin electrostatic discharge (ESD) element, and the method comprises:

providing a substrate structure, wherein the substrate structure comprises a semiconductor substrate, and a semiconductor fin for the fin ESD element and an electrode structure surrounding a part of the semiconductor fin that is on the semiconductor substrate, wherein the electrode structure comprises a first dielectric layer surrounding the part of the semiconductor fin and an electrode on the first dielectric layer;

forming a second dielectric layer on the substrate structure to cover the electrode structure;

forming, in the second dielectric layer, a trench extending to a top of the electrode, wherein the trench is on the electrode and extends along a longitudinal direction of the electrode, and wherein a transverse width of the trench is less than or equal to a transverse width of the top of the electrode; and filling the trench with a metal material, so as to form a metal heat sink that is on the top of the electrode and is coupled to the electrode, wherein the second dielectric layer further comprises an opening that is used to form electrode interconnection, where the opening and the trench are isolated from each other; and wherein the step of filling the trench with a metal material comprises filling the opening with the metal material, so as to form the electrode interconnection at the opening.

2. The method according to claim 1, wherein the substrate structure further comprises an isolation structure on the semiconductor substrate; wherein an upper surface of the isolation structure is lower than an upper surface of the semiconductor fin; and wherein the electrode structure is on the isolation structure.

3. The method according to claim 1, wherein the metal heat sink and the electrode interconnection are separated from each other, and upper surfaces thereof are substantially flush with each other.

4. The method according to claim 1, wherein there is at least one metal heat sink.

5. The method according to claim 1, wherein spacing of each formed trench is greater than 0.04 micrometer, and a distance between each trench and an edge at either side of the electrode is greater than 0.05 micrometer.

6. The method according to claim 1, wherein a material for forming the metal heat sink comprises tungsten or copper.

7. A semiconductor device, comprising a fin electro-static discharge (ESD) element, wherein the semiconductor device further comprises:

a substrate structure, wherein the substrate structure comprises a semiconductor substrate, and a semiconductor fin for the fin ESD element and an electrode structure surrounding a part of the semiconductor fin that are on the semiconductor substrate, where the electrode structure comprises a first dielectric layer surrounding the part of the semiconductor fin and an electrode on the first dielectric layer;

a second dielectric layer on the substrate structure; and a metal heat sink that is in the second dielectric layer, is on a top of the electrode, and is coupled to the electrode, wherein the metal heat sink extends along a longitudinal direction of the electrode, and wherein a transverse width of the metal heat sink is less than or equal to a transverse width of the top of the electrode, wherein the second dielectric layer further comprises electrode interconnection, and wherein the electrode interconnection and the metal heat sink are isolated from each other.

8. The semiconductor device according to claim 7, wherein the substrate structure further comprises an isolation structure on the semiconductor substrate; wherein an upper surface of the isolation structure is lower than an upper surface of the fin; and wherein the electrode structure is on the isolation structure.

9. The semiconductor device according to claim 7, wherein the metal heat sink and the electrode interconnection are separated from each other, and wherein an upper surface of the metal heat sink is substantially flush with an upper surface of the electrode interconnection.

10. The semiconductor device according to claim 7, wherein there is at least one metal heat sink.

11. The semiconductor device according to claim 7, wherein spacing of each heat sink in the metal heat sink is greater than 0.04 micrometer, and wherein a distance between each heat sink and an edge at either side of the electrode is greater than 0.05 micrometer.

12. The semiconductor device according to claim 7, wherein a metal material for forming the metal heat sink comprises tungsten or copper.

\* \* \* \* \*